United States Patent [19]

Marek et al.

[11] Patent Number: 5,373,239
[45] Date of Patent: Dec. 13, 1994

[54] SHIMMING METHOD

[75] Inventors: Daniel Marek, Möriken; Markus Häberli, Fällanden, both of Switzerland; Marcellus Burgers, Stutensee; Jean-Claude Riboulet, Rheinstetten, both of Germany

[73] Assignee: Bruker Analytische MeBtechnik GmbH, Germany

[21] Appl. No.: 68,538

[22] Filed: May 26, 1993

[30] Foreign Application Priority Data

May 27, 1992 [DE] Germany .............................. 4217496

[51] Int. Cl.$^5$ .............................................. G01R 33/20
[52] U.S. Cl. ........................................ 324/320; 324/318
[58] Field of Search ............... 324/320, 318, 319, 300; 335/299; 128/653.2, 653.5

[56] References Cited

U.S. PATENT DOCUMENTS

| 4,284,950 | 8/1981 | Burl et al. | 324/320 |
|---|---|---|---|
| 4,581,580 | 4/1986 | Keim | 324/320 |
| 4,623,844 | 11/1986 | Macovski | 324/320 |
| 4,652,826 | 3/1987 | Yamamoto et al. | 324/320 |
| 4,761,614 | 8/1988 | Prammer et al. | 324/320 |
| 4,862,087 | 8/1989 | Hillenbrand et al. | 324/320 |
| 5,006,804 | 5/1991 | Dorri et al. | 324/320 |

FOREIGN PATENT DOCUMENTS

| 230027 | 7/1987 | European Pat. Off. . |
|---|---|---|
| 3508332 | 3/1985 | Germany . |
| 3524303 | 7/1985 | Germany . |
| 2027208 | 2/1980 | United Kingdom . |

OTHER PUBLICATIONS

Gwendolyn N. Chmurny and David I. Hoult, The Ancient and Honourable Art of Shimming, (Concepts in Magnetic Resonance, 1990, 2, 131-149).

*Primary Examiner*—Kenneth A. Wieder
*Assistant Examiner*—Raymond Y. Mah
*Attorney, Agent, or Firm*—Walter A. Hackler

[57] ABSTRACT

The invention concerns a method for adjusting the desired current values of shim coils of a tesseral harmonic (off axis) shim system in order, in particular in the center of the shim system, to produce as homogeneous a magnetic field as possible. Utilizing a minimal number of measuring points and appropriate linear combinations of the corresponding measurement values with and without switching on the corresponding shim coil, a simple, systematic and reliable measurement method is introduced which does not require any iterative procedure. The method can be used by itself or the desired current values can serve as starting values for a further shimming procedure.

13 Claims, 3 Drawing Sheets

SHIMMING METHOD

BACKGROUND OF THE INVENTION

The invention concerns a method for adjusting the desired shim coil current values of a, in particular, tesseral-harmonic (offaxis) shim system to produce, in particular in the vicinity of the center of the shim system, a homogeneous magnetic field.

Such a procedure is known in the art from the laid open publications DE 35 08 332 A1, EP 0 219 013 A2 and the Journal Article "The Ancient and Honorable Art of Shimming", G.N. Chmurny and D.I. Hoult, Concepts in Magnet Resonance, 1990, 2, 131–149. The laid open publication DE 35 08 332 A1 describes a procedure and an apparatus for the production of particularly homogeneous magnetic fields with which the distribution of the main field which is to be rendered homogeneous is measured at a plurality of points so that an optimum magnetic field can be determined in a simple and reliable fashion, the field being generated via computer using a correction magnetic field production apparatus, the correction magnetic field being utilized for optimizing and producing the particularly homogeneous magnetic field. The invention utilizes the method of smallest quadratics in order to determine optimal values of the correction magnetic field. Initially, a cube with a side length of 0.3 meters is taken for the chosen region wherein the magnetic field is supposed to be homogeneous and the main field distribution is recorded in a plurality of characteristic planes, by way of example $z=0.15$ m, $z=0$, $z=-0.15$ m at e.g. 343 measurement points within the cube. In this manner, the 3-dimensional field distribution of the main field which is to be rendered homogeneous is measured at predetermined coordinates via a determination of a plurality of local main field values. The field distribution obtained in this manner is represented by a polynomial which includes a spatially unchanging component, a spatially changing component and a negligibly small residual component and, using the terms of the spatially changing components of the main field, the regulating current through the correcting coils with which the corresponding inhomogeneities are compensated is calculated. The purpose of this invention is to present a method and an apparatus for the production of particularly homogeneous magnetic fields which allows for an improved and more rapid homogenization of the magnetic fields than was previously possible.

EP 0 291 013 A2 describes a method for the minimization of the inhomogeneities of a static bain field through the utilization of a plurality n of shim coils. The method is carried out in such a manner that, initially, the magnitude of the main magnet field is measured without shim fields at a plurality of locations on the surface of an imaginary sphere. Subsequently, the magnitude and the polarity of each of n shim fields is measured as a function of the magnitude and polarity of a DC current flowing through the corresponding shim coil at the same locations on the imaginary spherical surface. Subsequently, an average quadratic error of the total field from the homogeneous field is determined at a plurality of other points within the volume of the imaginary sphere. Finally, the magnitude and the polarity of each current of the n-fold shim coil system is so adjusted that the previously determined error is minimized. The method assumes that the magnet field is expanded in a series expansion of spherical harmonics and that the corresponding correction coils produce partial fields which corresponding to spherical harmonic polynomials. The measurements on the surface of the imaginary sphere are carried out at points where the corresponding spherical harmonics have zeros to, in this matter, determine the strength of the current through the corresponding shim coil.

In the journal article "The Ancient and Honorable Art of Shimming", G.N. Chmurny and D.I. Hoult, a method is presented for the shimming of, in particular, a superconducting magnet for high resolution nuclear magnetic resonance. In contrast to the above-mentioned publications, where a plurality of measuring values of the main field with and without switching on of the shim coils is initially obtained and subsequently, using these obtained measuring points, the desired nominal current value of the shim coils is calculated, Chmurny and Hoult examine the influence of the various field inhomogeneities on the line width or the oscillating nuclear resonance signal of a sample excited by nuclear resonance. By means of iterative steps and by determination of the influence of the various shim coils on the nuclear resonance signal as a function of their current values, an optimal adjustment of the shim coils is achieved.

The above mentioned methods in accordance with the laid open publications DE 35 08 332 A1 and EP 0 219 013 A2 have the disadvantage that a large number of measuring points must be obtained under certain geometric relationships to another, resulting in a time consuming method and a complicated mechanical apparatus for the adjustment of the various measuring points. Furthermore, they require a fitting algorithm in order to produce the necessary comparison between the measurement data and the homogeneity condition which, in turn, does not always lead to an optimal solution. The Chmurny-and-Hoult-method has the disadvantage that a systematic method which, even when used by an inexperienced operator or technician would lead to a reliable and reproducible result, is not proposed which in turn, leads to results which depend strongly on the experience and the abilities of the individual who carries out the method. In addition, the result is not always achieved within tolerable homogeneity limits and/or the available adjustment time.

Therefore, it is the purpose of the present invention to produce a method for the adjustment of the current values of shim coils of a, in particular, tesseral-harmonic (off-axis) shim system which creates a simple systematic and reliable method which can even be carried out by an inexperienced technician to achieve reproducible and reliable results with which a minimum number of measurement points are necessary and a fitting algorithm is avoided.

SUMMARY OF THE INVENTION

This purpose is achieved in accordance with the invention in that, initially, at particular measuring points, measurement values of the main field and magnet field are recorded without and with respective feeding of a shim coil normalization current, whereby at each measuring point the main field and, by switching on one shim coil at a time, the magnet field are sampled at least once until all the shim fields which are to be measured at this measuring point are recorded and after recording all measuring points, the desired current value of each shim coil is determined by means of a linear combination of measurement values which is particularly sensitive to the corresponding shim field, whereby each linear combination is comprised of a magnet field and a main field linear combination which, for their part, differ from each other in that the magnet and main field linear combinations are obtained with and without the feeding of the corresponding shim coil normalization currents respectively. The method in accordance with the invention is designated as OSAM (Off Axis Shimming by Analysis of the Magnetic Field).

In this fashion the purpose of the invention is completely achieved. The selection of particular measuring points which take advantage of the symmetry properties of the spherical harmonics and the utilization of a particularly sensitive linear combination of these measuring values in order to determine the desired current values of the corresponding shim coil allows for a minimum number of measuring points with maximum sensitivity for the corresponding shim coil, whereby an effective decoupling of the corresponding shim field is achieved which for its part means that it is not necessary to carry out an iterative process. The switching on and off of the normalization current of one shim coil at a time until all the shim fields to be measured at this particular measuring point are recorded allows for a rapid recording of the measurement values of all the shim coils without the repetitive geometrical adjustment of the measuring points which, for its part, saves time and leads to a reliable measurement procedure. In addition, a separate determination of the strength of the shim coils is not necessary, that is to say, the procedure is "selfcalibrating".

In an advantageous embodiment of the invention, the shimming method is repeated iteratively, whereby the shim coils are supplied with the desired current values of the previous shimming procedure in order to produce shim fields which are part of a new main field and this new main field is rendered homogeneous through the application of a second iteration of the procedure.

More specifically, the method in accordance with the instant invention involves first establishing a main magnet field with a center $r=0$ and then expressing the main magnet field as a sum of orthogonal functions, correlating one orthogonal function to each shim coil.

Next, the method involves selecting a set of measuring points and determining which shim coils are to be measured at each measuring point. A measuring point $j$ is selected from the set of points and the main magnet field is measured at that point to produce a main field measurement value $H^0(\vec{r}_j)$.

The following steps are repeated until all shim coils to be measured at point $j$ have been selected, fed with a normalization current and measured: a shim coil $i$ is selected from the shim coils to be measured at the measuring point $j$. A normalization current is fed through the shim coil $i$ and the shim field is measured having a shim field measurement value $H_j(\vec{r}_j)$. At measuring point $j$, a coined magnet field, consisting of the sum of the main magnet field plus the shim field, is measured, producing the value $H^C(\vec{r}_j) = H_i(\vec{r}_j) + H^0(\vec{r}_j)$.

Subsequently, another measuring point $j$ is selected from the set and the above steps are repeated until all of the measuring points from the set have been selected.

For each shim coil $i$, coefficients $a_{ji}$ are selected to construct a main field linear combination $$L_i^0 = \sum_j a_{ji} H^0(r_j)$$

which at the measuring points selected earlier, depends essentially on the orthogonal function correlated to the shim coil i.

The next step involves constructing a shim field linear combination $$L_i = \sum_j a_{ji} H_i(r_j)$$

of the shim field measurement values. Finally, the desired current values $I_i$ are determined from the main and shim field linear combinations.

This measure has the advantage that the initially very inhomogeneous magnetic field is substantially homogenized in a first pass through the shim procedure and becomes, in a second pass or in successive iterative executions of the shim procedure, more and more homogeneous. In this manner, possible couplings or measurement errors of a previous shimming method can be improved or eliminated through successive execution of the method.

In a further advantageous embodiment of the invention the desired current values are determined through the following equation:

$$I_i = \frac{-N L_i^0}{L_i^N}$$

whereby N designates the normalization current and $L_i^N$ correspond to the recorded shim field linear combination with and without the normalization current N, respectively.

This measure has the advantage that the linear dependence of the shim coils is optimally utilized in order to obtain a very fast determination of the desired current value of the corresponding shim coil by carrying out a linear interpolation.

In an advantageous embodiment of the invention the center is located on a central axis running parallel to the magnet field, (z-axis) about which the measuring points are arranged at a constant radial separation.

This measure has the advantage that a reproducible and easily adjusted geometrical configuration of the measuring points is achieved which takes advantage of the symmetry properties of the tesseral harmonic terms of the spherical harmonics.

In a particularly advantageous embodiment of the invention the measuring points are located in a central plane perpendicular to the homogeneous magnet field and containing the center, and/or in each of two, mirror symmetrically displaced from and parallel to the central plane, partial planes of at least one plane-pair.

This measure has the advantage that the desired current values of the shim coils having a z-dependence can be determined with a minimum number of measuring points which, furthermore, take advantage of the symmetry properties of the spherical harmonics.

In another embodiment of the invention, a second pair of planes is provided for which is more distant from the center than the first pair.

This measure has the advantage that, in particular, by way of example, for the adjustment of shim coils of fourth order which exhibit a $z^3$-dependence, a larger sensitivity is achieved due to the larger z-separation.

In a further advantageous embodiment of the invention, the method is applied to nuclear magnetic resonance spectroscopy and/or nuclear magnetic resonance tomography.

This measure has the advantage that the requirements of extremely high homogeneous magnetic fields of $10^{-8}$ homogeneity for spectroscopy and $10^{-5}$ over a large volume for tomography, can be achieved. The availability of nuclear resonance methods enables the magnet field measurements necessary for the method to be carried out due to the available nuclear spin resonance apparatus.

In a variation of this embodiment, the desired current values which are adjusted via the OSAM method serve as initial values or a further shimming procedure.

This measure has the advantage that, initially, a shimming procedure which is simple and reliable to adjust, namely the OSAM procedure, is carried out in order to obtain desired current values which lie very close to the final optimum desired current values and, subsequently, these optimum values can be effected using conventional shim methods which are, per se, known in the art, whereby the nuclear spin resonance technique is used in order to achieve as small a nuclear spin resonance line as possible and/or a slowly decaying nuclear resonance signal. In this manner, the advantages of OSAM and the advantages of the nuclear spin resonance shimming procedure which is, per se, known in the art are taken advantage of.

Further advantages can be derived from the description and the accompanying drawings. Clearly, the above-mentioned and the features which are described below can be utilized not only in the corresponding combination given but also in other combinations or by themselves without departing from the framework of the present invention.

Embodiments of the invention are shown in the drawings and are explained in the following description. Shown are:

DESCRIPTION OF THE PREFERRED EMBODIMENT

Figure 1:
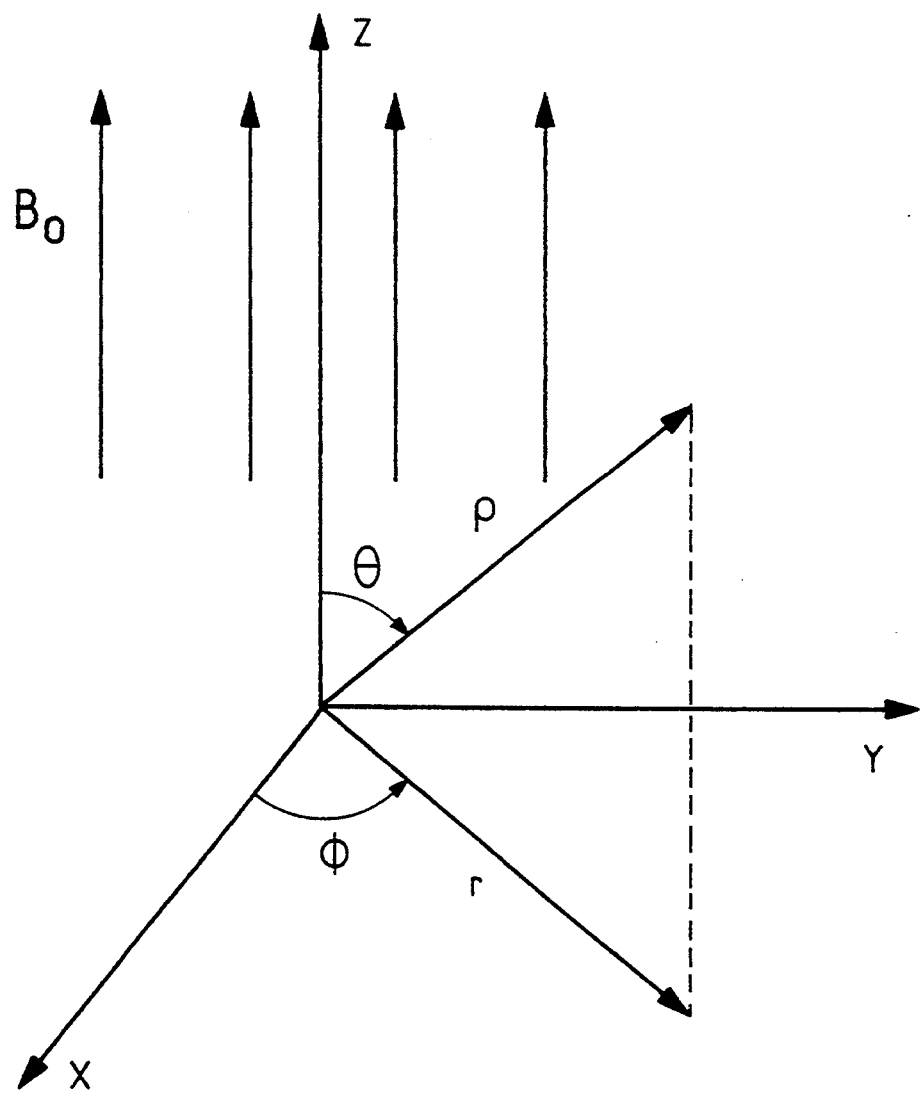
FIG. 1 spherical and cylindrical coordinates of the geometry of the method.

FIG. 1 shows the geometry of the method according to the invention. The coordinates are such that the z-axis runs through the center parallel to the main field to be shimmed or to the magnet field $B_0$. The usual spherical coordinates $\rho$, $\theta$ and $\phi$ as well as the corresponding conventional cylindrical coordinates r, $\phi$ and z and the cartesian coordinates x, y and z are given.

In order to achieve as homogeneous a field as possible for, by way of example, NMR spectroscopy applications, one utilizes auxiliary coils which produce fields with the assistance of which one can compensate, within certain limits, for inhomogeneities of the main coil. The optimum current in these coils is initially unknown and must be determined experimentally. Each shim coil produces a characteristic magnetic field. One can show Mathematically that the field in the bore of a magnet in the vicinity of the magnetic center can be described by an expansion in spherical harmonic functions in the following manner:

$$H(r,z,\phi) = \qquad (1)$$

$$\sum_{l=0}^{l} \sum_{m=0}^{l} \left(\frac{\rho}{a}\right)^l [A_{lm}\cos(m\phi) + B_{lm}\sin(m\phi)]P_l^m(\cos\theta)$$

whereby the various variables of equation (1) can be taken from the cylindrical or spherical coordinate system of FIG. 1. The variable a corresponds to the radius of the main coil producing the main magnet field and $$P_{lm}(x) = \frac{(-1)^m}{2^l l!} (1 - x^2)^{m/2} (d/dx)^{l+m}[(x^2 - 1)^l] \qquad (2)$$

are associated Legendre polynomials. The quantities $A_{lm}$ and $B_{lm}$ describe the gradient strength of the field. When one utilizes cylindrical coordinates and writes out the first term of equation 1, one obtains, $$H(r,z,\phi) = H_0 + 0(z,z^2, z^3, \ldots) + A_{11}r\cos(\phi) + \qquad (3)$$

$$B_{11}r\sin(\phi) + A_{21}zr\cos(\phi) + B_{21}zr\sin(\phi) +$$

$$A_{22}r^2\cos(2\phi) + B_{22}r^2\sin(2\phi) + \ldots,$$

whereby the separations r, x, y, and z are dimensionless and are relative to the effective magnet radius a, $H_0$ is the desired homogeneous field and only tesseral harmonic terms up to second order are described. The terms correspond to a separation of the entire field in fields which can be produced by the shim coils. Each individual shim coil is thereby utilized to compensate for the corresponding term of this sum with its field.

In the general case, it is possible to determine the desired current values of a shim coil in that one measures the magnetic field at a plurality of particularly special points in space which, due to the symmetry properties of the corresponding gradient field, are particularly sensitive to this field component or correcting coil. Through a repetition of the measurement once with and once without switching on the corresponding correction coil, it is also possible to determine the corresponding field strength produced by the shim coil per unit current strength of the corresponding shim coil. Every shim coil has a set of points (z,$\phi$) at fixed r at which one must measure the field and a linear combination of these measuring values which enables the corresponding gradients of the field to be calculated and the strength of the shims to be determined. The choice of the points and the calculation procedures are characterized in that the influence of the other gradients are completely or at least partially absent.

Table 1 summarizes the relationship between the gradient variables $A_{1m}$ and $B_{1m}$ and their corresponding functional field dependencies in cartesian and cylindrical coordinates respectively. The corresponding designation of the shim coil is also given so that, by way of example, the x-coil exhibits the field dependence of the $A_{11}$ gradient.

In order to clearly demonstrate the correction procedure one can consider a concrete example. One assumes, for example, that the main field exhibits only an $A_{11}$— and $A_{22}$ gradient. If one adjusts the main field without switching on the gradient coil at z=0 and $\phi$=0 i.e. (0,0) and at z=0 and $\phi$=180° i.e. (0,180) and calculates the difference $\Delta$ between these two measuring field measurements, one obtains a field difference which depends only on the $A_{11}$ term, $$
\begin{aligned}
H(z,\phi) &= H_o + A_{11}r\cos(\phi) + A_{22}r\cos(2\phi) \quad (4)\\
\Delta &= H(0,0) - H(0,180)\\
&= 2A_{11}r + A_{22}r^2\cos(0) - A_{22}r^2\cos(360)\\
&= 2A_{11}r,
\end{aligned}
$$

whereby the measurement is to be carried out at a specific constant radius r. The field dependence of the $A_{22}$ term is eliminated by subtraction. To determine the desired current value for the x-coil that eliminates the $A_{11}$ field gradient, one only needs to repeat the measurement according to equation 4 with the coil switched on. In this fashion one obtains a second $\Delta$ value at a particular normalization current value of the x-coil.

Figure 2:
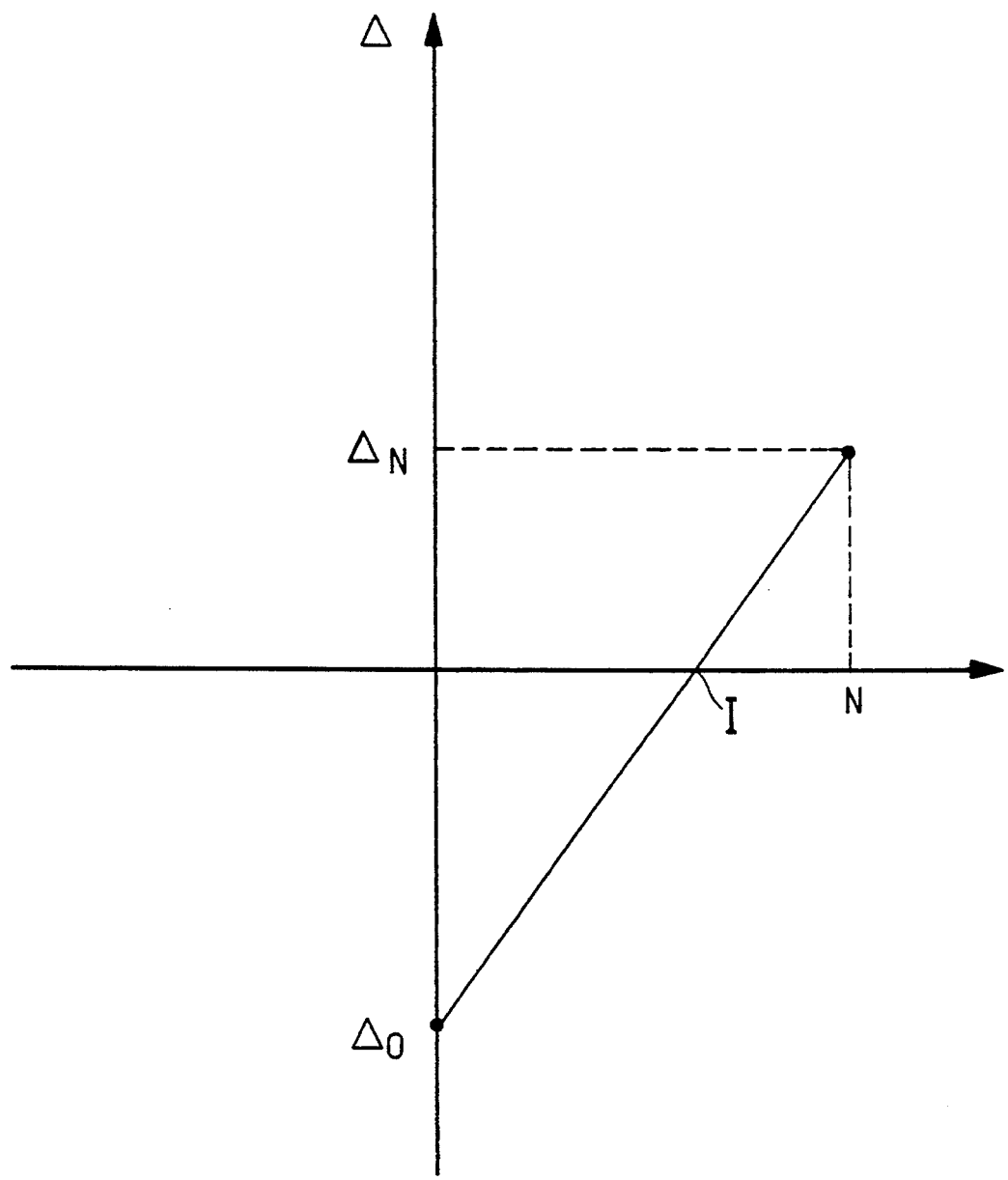
FIG. 2 interpolation procedure in accordance with the invention.

Since $\Delta$ depends linearly on the current in the x coil, one obtains the graphical representation of FIG. 2, whereby the current value is plotted on the abscissa and the a $\Delta$-value on the ordinate. The measurement without current gives the $\Delta_0$ measurement value and the a $\Delta_N$ value corresponds to the measurement at a particular current value of N. The desired current of the x-coil is namely the value where $\Delta=0$, i.e. point I in FIG. 2. This point can be determined through a simple linear interpolation between the two measured $\Delta$ values, i.e.

$$I = \frac{-N\Delta_o}{\Delta_N - \Delta_o} \quad (5)$$

whereby I is the desired current value, N the current value of the x-coil during the second measurement, $\Delta_0$ the $\Delta$ value without switching on the shim coil, and $\Delta_N$ of the corresponding $\Delta$-value of the x-coil at a current strength N.

Through an appropriate selection of the measuring points for certain symmetry characteristics of the different shim coils, it is possible to obtain $\Delta$-values which are particularly sensitive to a particular gradient while, at the same time, being largely insensitive to the other gradients. Table 2 lists such a set of measuring points and their corresponding $\Delta$ linear combinations for the different shim coils, whereby the abbreviation $(z,\phi)$ is utilized for the geometrical measuring points. The table also shows, for measurements of a particular coil, which other gradient fields are coupled to this measurement. By way of example, the x-coil method shown contains a (undesired) coupling to the $xz^2$ and $x^3$ gradients. From this table one sees that, in accordance with the invention, the measuring points and linear combinations are reduced from a possible number of 182 to only 8.

The remaining couplings can, in principle, also be eliminated since additional information with respect to these coupled gradients is available which can be utilized to effectively subtract the coupled gradients from the desired gradients. In the case of the x- and y-gradients the coupled gradients $xz^2$, $x^3$ and $yz^2$, $y^3$, respectively, are each cleanly measured in an uncoupled fashion and via their corresponding measuring points and linear combinations, are fundamentally known. Therefore, their contribution to the distortion of the determination of the desired current value of the x-coil can be corrected. In the xz- or yz-gradient case one takes advantage of the fact that in the determination of the xz desired current value, the $xz^3$-coil is coupled, but also in the determination of the desired current value of the $xz^3$-coil, a xz coupling is present. The corresponding $\Delta$-value linear combinations form two equations with two unknown quantities (the $xz^3$ and xz gradient fields) and these are each individually solvable for the $xz^3$ and xz values. Such corrections are usually small and require no additional measuring points or switching of the corresponding gradient fields, rather are carried out in the calculation phase of the linear combination.

Table 3 shows an effective measurement program for carrying out the invention. One starts, for example, at $z = -2$ cm and $\phi = 0°$ and measures first without and then with switching on the $xz^3$ shim coil. $\phi$ is then changed to 90° and one measures once more without any shim coils and then with the $yz^3$ shim coil. The angle is then changed to 180° and one measures first without shim coils and then with switching in the $xz^3$ coil, and finally at 270° with and without $yz^3$. The field is then measured at $z = -1$ cm and at 0° first without the gradient coil and then with successive switching in of the xz, $xz^2$ and $(x^2-y^2)z$. All data are, in this matter, systematically obtained and the linear combination calculating procedure is first carried out subsequently. As mentioned above, all measurements are carried out at a particular radial separation from the central axis r, by way of example, $r=0.75$ cm. Preferentially, this measurement procedure is first carried out after adjustment of the z-gradient field in a method which is per se known in the art. of course, one can first carry out the measurement procedure after the corresponding $z=0$ and $\phi=0$ reference points have been determined and, that is, with respect to the gradient coils in a manner which is per se known in the art. Clearly, it is also possible to make measurements at larger or even changing radius r and/or distances z in order to obtain an improved sensitivity with respect to certain gradient fields, in particular, for the higher order gradients due to their strong r and z dependencies.

Figure 3:
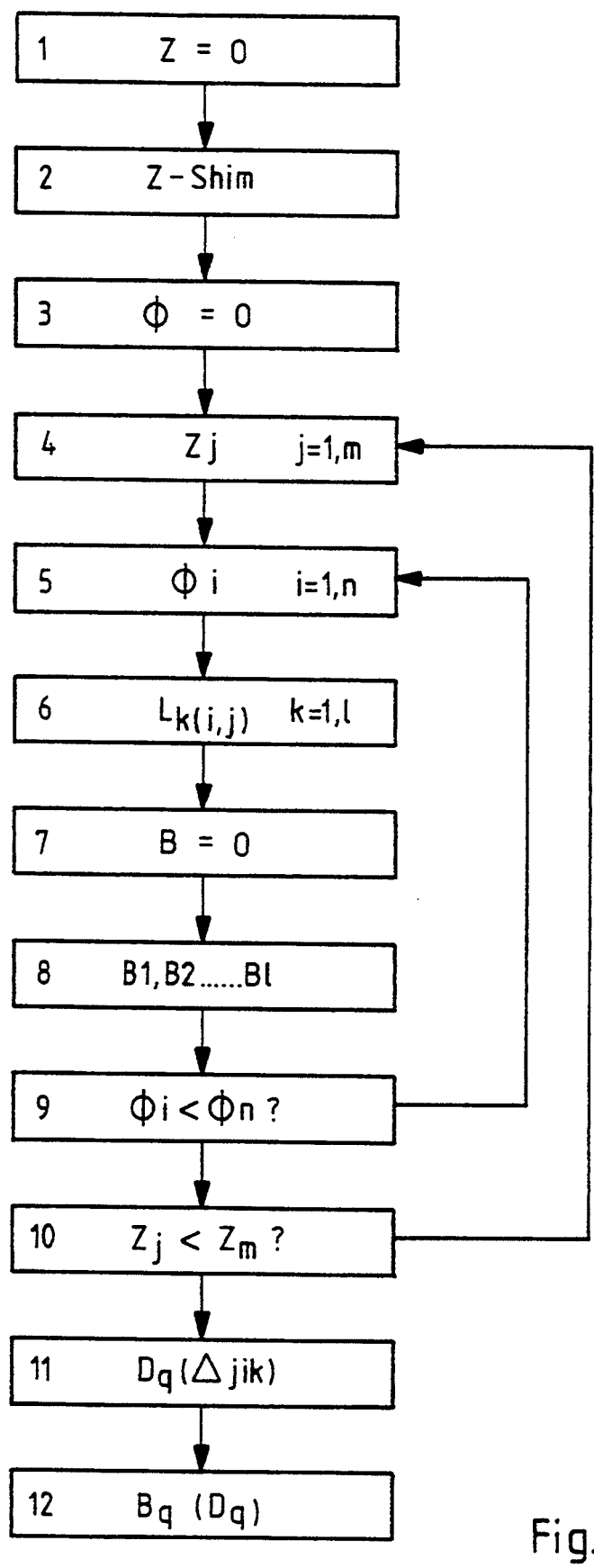
FIG. 3 flow diagram of the method in accordance with the invention.

FIG. 3 is a flow diagram of an embodiment in accordance with the method in accordance with the invention. Initially one determines, in a method per se known in the art, the $z=0$ (step 1) plane. Afterwards, the z-shim is optimized in step 2. If the field measurements are obtained by means of nuclear magnetic resonance (NMR), this optimization is achieved through an adjustment of as small an NMR resonance line width as possible. After the determination in a per se known in the art fashion in step 3 of the $\phi=0$ position, one begins to measure. Initially, in step 4, the first of m z-planes to be measured is set. One begins, in step 5, to measure the first of n angles to be measured in this z-plane. Initially, in a step 6, a list of the l shim coils to be measured at this z, $\phi$ measurement point is read out. Subsequently, in the step 7 the field is recorded without applying any normalization currents. In a step 8, all shim coils which are to be measured are each successively switched in until the whole list of the l coils to be measured is sampled. In step 9, one checks if all the angles to be sampled in this plane are finished and if not, the next angle (step 5) is adjusted, and at this new angle n, the subsequent steps 6 to 9 are again repeated, whereby in general in step 6 the list of the coils to be measured at this new angle is different. When all the measuring angles are finished one compares, in step 10, whether all the planes to be measured are finished. If not the next plane is selected (step 4) and the corresponding angles and measuring values are obtained. In step 11 all the measurement values are obtained and one constructs the various linear combinations and calculates the desired currents of the various shim coils. In step 12 the desired values of the P shim coils are adjusted.

A comparison, for the tesseral harmonic shim coils of a 500 mHz-Nuclear Magnetic Resonance Magnet System, between the measurement procedure in accordance with the invention (OSAM) and the final desired current values subsequently obtained by carrying out a shim procedure in accordance with, by way of example, Chmurny and Hoult can be extracted from Table 4. The relative difference between the values determined by OSAM and the final optimized values is listed. With the OSAM procedure one obtains, in a fast and reproducible fashion, desired current values which lie very close to the optimum values without tedious additional adjustment procedures which, for their part, lead to the difficulties mentioned above in connection with the prior art.

TABLE 2-continued

| Shim coil | Δ (z,φ) | Coupling |
|---|---|---|
| $xz^3$ | (2,0) − (2,180) − (−2,0) + (−2,180) | xz |
| $yz^3$ | (2,90) − (2,270) − (−2,90) + (−2,270) | yz |

TABLE 3

| 2-plane | | | | | | | | | angle | | | | | | | |
|---|---|---|---|---|---|---|---|---|---|---|---|---|---|---|---|---|
| | 0 | 30 | 45 | 60 | 90 | 120 | 135 | 150 | 180 | 210 | 225 | 240 | 270 | 300 | 315 | 330 |
| −2 | $xz^3$ | | | | $yz^3$ | | | | $xz^3$ | | | | $yz^3$ | | | |
| −1 | xz $xz^2$ $(x^2-y^2)z$ | | xyz | | yz $yz^2$ $(x^2-y^2)z$ | | xyz | | xz $xz^2$ $(x^2-y^2)z$ | | xyz | | yz $yz^2$ $(x^2-y^2)z$ | | xyz | |
| 0 | x $(x^2-y^2)$ $xz^2$ $x^3$ | $y^3$ | xy | $x^3$ | y $(x^2-y^2)$ $yz^2$ $y^3$ | | $x^3$ | xy | $y^3$ | x $(x^2-y^2)$ $xz^2$ $x^3$ | $y^3$ | xy | $x^3$ | y $(x^2-y^2)$ $yz^2$ $y^3$ | $x^3$ | xy | $y^3$ |
| +1 | xz $xz^2$ $(x^2-y^2)z$ | | xyz | | yz $yz^2$ $(x^2-y^2)z$ | | xyz | | xz $xz^2$ $(x^2-y^2)z$ | | xyz | | yz $yz^2$ $(x^2-y^2)z$ | | xyz | |
| +2 | $xz^3$ | | | | $yz^3$ | | | | $xz^3$ | | | | $yz^3$ | | | |

TABLE 1

| | Field dependence | | |
|---|---|---|---|
| Gradient | Cartesian coordinates | Cylindrical coordinates | Designation |
| $A_{11}$ | x | $r\cos\phi$ | x |
| $B_{11}$ | y | $r\sin\phi$ | y |
| $A_{21}$ | zx | $zr\cos\phi$ | zx |
| $B_{21}$ | zy | $zr\sin\phi$ | zy |
| $A_{31}$ | $x[4z^2 - (x^2 + y^2)]$ | $(4z^2 - r^2)r\cos\phi$ | $z^2x$ |
| $B_{31}$ | $y[4z^2 - (x^2 + y^2)]$ | $(4z^2 - r^2)r\sin\phi$ | $z^2y$ |
| $A_{22}$ | $x^2 - y^2$ | $r^2\cos2\phi$ | $x^2 - y^2$ |
| $B_{22}$ | xy | $r^2\sin2\phi$ | xy |
| $A_{32}$ | $z(x^2 - y^2)$ | $zr^2\cos2\phi$ | $z(x^2 - y^2)$ |
| $B_{32}$ | xyz | $zr^2\sin2\phi$ | zxy |
| $A_{33}$ | $x(x^2 - 3y^2)$ | $r^3\cos3\phi$ | $x^3$ |
| $B_{33}$ | $y(3x^2 - y^2)$ | $r^3\sin3\phi$ | $y^3$ |
| $A_{41}$ | $x[4z^3 - 3z(x^2 + y^2)]$ | $(4z^3 - 3zr^2)r\cos\phi$ | $xz^3$ |
| $B_{41}$ | $y[4z^3 - 3z(x^2 + y^2)]$ | $(4z^3 - 3zr^2)r\sin\phi$ | $yz^3$ |

TABLE 2

| Shim coil | Δ (z,φ) | Coupling |
|---|---|---|
| x | (0,0) − (0,180) | $xy^2$, $x^3$ |
| y | (0,90) − (0,270) | $yz^2$, $y^3$ |
| xz | (1,0) − (1,180) − (−1,0) + (−1,180) | $xz^3$ |
| yz | (1,90) − (1,270) − (−1,90) + (−1,270) | $yz^3$ |
| xy | (0,45) − (0,135) + (0,225) − (0,315) | — |
| $(x^2 - y^2)$ | (0,0) − (0,90) + (0,180) − (0,270) | — |
| $xz^2$ | (1,0) − (1,180) + (−1,0) − (−1,180°) − 2(0,0) + 2(0,180) | — |
| $yz^2$ | (1,90) − (1,270) + (−1,90) − (−1,270) − 2(0,90) + 2(0,270) | — |
| $x^3$ | (0,0) − (0,60) + (0,120) − (0,180) + (0,240) − (0,300) | — |
| $y^3$ | (0,30) − (0,90) + (0,150) − (0,210) + (0,270) − (0,330) | — |
| xyz | (1,45) − (1,135) + (1,225) − (1,315) − (−1,45) + (−1,135) − (−1,225) + (−1,315) | — |
| $(x^2 - y^2)z$ | (1,0) − (1,90) + (1,180) − (1,270) − (−1,0) + (−1,90) − (−1,180) + (−1,270) | — |

TABLE 4

| Offaxis Shims | OSAM values | Optimised value | Rel. difference |
|---|---|---|---|
| X | 152 | 179 | 15% |
| Y | 1053 | 1066 | 1% |
| XZ | −1118 | −975 | 15% |
| YZ | −3264 | −3151 | 4% |
| XY | −662 | −775 | 15% |
| $X^2 - Y^2$ | −247 | −287 | 14% |
| $XZ^2$ | 2677 | 2684 | 0% |
| $YZ^2$ | −3755 | −3924 | 4% |
| ZXY | −2226 | −2938 | 24% |
| $Z(X^2 - Y^2)$ | −3434 | −3432 | 0% |
| $X^3$ | 822 | 1303 | 37% |
| $Y^3$ | −4145 | −3590 | 15% |
| $Z^3X$ | 7.5* | 7* | 7% |
| $Z^3Y$ | 5* | 5* | 0% |

Potentiometer units on a B-SN 2

We claim:

1. A method for setting the desired current values $I_i$ of shim coils for rendering a main magnet field homogeneous comprising the steps of:
   a) establishing a main magnet field with a center $\bar{r}=0$;
   b) expressing the main magnet field as a sum of orthogonal functions;
   c) correlating one orthogonal function to each shim coil;
   d) selecting a set of measuring points;
   e) determining which shim coils are to be measured at each measuring point;
   f) selecting a measuring point j from the set of points of step d);
   g) measuring the main magnet field at the measuring point of step f) to produce a main field measurement value $H^0(\bar{r}j)$;
   h) selecting a shim coil i from the shim coils determined in step e) to be measured at the measuring point j of step f);
   i) feeding a current through the coil of step h) to produce a shim field having a shim field measurement value $H_i(\bar{r}j)$;
   j) measuring, at measuring point j, a combined magnet field consisting of a sum of the main magnet field plus the shim field to produce a combined field measurement value $H^c(\bar{r}j) = H_i(\bar{r}_j) + H^0(\bar{r}_j)$;
   k) repeating steps h) through j) until all shim coils to be measured at the measuring point j have been selected, fed with normalization current, and measured;

l) repeating steps f) through k) until all measuring points of step d) have been selected;

m) selecting, for each shim coil i coefficients $a_{ji}$ to construct a main field linear combination $$L_i^p = \sum_j a_{ji} H^0(r_j)$$

which, at the measuring points selected in steps d) and e), depends essentially on the orthogonal function correlated to the shim coil i;

n) constructing, for each shim coil i using the same coefficients $a_{ji}$ of step m), a shim field linear combination $$L_i = \sum_j a_{ji} H_i(r_j)$$

of the shim field measurement values; and o) determining the desired current values $I_i$ from the main and shim field linear combinations.

2. The method of claim 1 further comprising the steps of:

p) feeding the desired current values $I_i$ of step o) into the i shim coils to establish a corrected main magnet field;

q) repeating steps b) through o) to establish corrected desired current values; and r) repeating steps p) and g) until the main magnet field is homogeneous.

3. The method of claim 1, wherein the desired current values are determined in step o) by the following equation, $$I_i = \frac{-N L_i^p}{L_i^N}$$

whereby N designates the normalization current and $L_i^N$ corresponds to the shim field linear combination determined at normalization current N.

4. The method of claim 1, wherein the main magnet field has a central axis intersecting the center and running parallel to the main magnet field, and the measuring points are at constant radial separations from the central axis.

5. The method of claim 1, wherein the main magnet field has a central axis intersecting the center and field has a central axis intersecting the center and running parallel to the main magnet field, and the measuring points are located in a central plane perpendicular to the central axis and containing the center and in a first measuring plane pair comprising two additional Dianes displaced mirror symmetrically from and parallel to the central plane.

6. The method of claim 5, further comprising a second measuring plane pair containing measuring points and located parallel to the first plane pair and displaced further from the center than the first plane pair.

7. The method of claim 1, wherein the main magnet field has a central axis intersecting the center and running parallel to the main magnet field, and the measuring points corresponding to a shim coil are located in a plane and exhibit equally spaced azimuthal angles about the central axis.

8. The method of claim 1, wherein the main magnet field has a central axis intersecting the center and running parallel to the main magnet field and the measuring points exhibit azimuthal angles with respect to the central axis of 0, 30, 45, 60, 90, 120, 135, 150, 180, 210, 225, 240, 270, 300, 315, and 330 degrees.

9. The method of claim 1, wherein the main magnet field has a central axis intersecting the center and running parallel to the main magnet field, with the main magnet field being expanded in spherical harmonic functions having off-axis terms, and the measuring points exhibit azimuthal angles with respect to the central axis at particular angular degrees with, at 0 degrees, measuring values being obtained for the $xz^3xz$, $xz^2$, $(x^2-y^2)z$, x, $(x^2y^2)$, x, z, $(x^2-y^2)$, $xz^2$, and $x^3$ shim coils, at 30 degrees for a $y^3$ shim coil, at 45 degrees for a xyz and xy shim coil, at 60 degrees for a $x^3$ shim coil, at 90 degrees for $yz^3$ yz $yz^2$ $(x^2-y^2)z$, Y $(x^2-y^2)$, $yz^2$, and $y^3$ shim coils, at 120 degrees for a $x^3$ shim coil, at 135 degrees for a xyz and xy shim coil, at 150 degrees for a $y^3$ shim coil, at 180 degrees for $xz^3xz$ $xz^2(x^2-y^2)z$, x, $(x^2-y^2)$, $xz^2$, and $x^3$ shim coils, at 210 degrees for a $y^3$ shim coil, at 225 degrees for a xyz and xy shim coil, at 240 degrees for a $x^3$ shim coil, at 270 degrees for $yz^3$, yz, $yz^2$, $(x^2-y^2)z$, y, $(x^2-y^2)$, $yz^2$, and $y^3$ shim coils, at 300 degrees $x^3$shim coil, at 315 degrees for a xyz and xy shim coil, and at 330 degrees for a $y^3$ shim coil.

10. The method of claim 1, wherein the main magnet field is adapted for use in a nuclear spin resonance spectrometer.

11. The method of claim 1, wherein the main magnet field is adapted for use in a nuclear Spill resonance tomograph.

12. The method according to claim 10, wherein the measurement values of the main field and shim field are determined utilizing nuclear magnetic resonance.

13. The method according to claim 11, wherein the measurement values of the main field and shim field are determined utilizing nuclear magnetic resonance.

* * * * *